United States Patent [19]

Takiguchi et al.

[11] Patent Number: 4,658,403

[45] Date of Patent: Apr. 14, 1987

[54] OPTICAL ELEMENT IN SEMICONDUCTOR LASER DEVICE HAVING A DIFFRACTION GRATING AND IMPROVED RESONANCE CHARACTERISTICS

[75] Inventors: Haruhisa Takiguchi, Osaka; Shinji Kaneiwa; Sadayoshi Matsui, both of Tenri; Mototaka Taneya, Sakai, all of Japan

[73] Assignee: Sharp Kabushiki Kaisha, Osaka, Japan

[21] Appl. No.: 666,979

[22] Filed: Oct. 31, 1984

[30] Foreign Application Priority Data

Nov. 8, 1983 [JP] Japan .................................. 58-210369

[51] Int. Cl.$^4$ ................................................ H01S 3/19
[52] U.S. Cl. ........................................ 372/96; 372/46
[58] Field of Search ...................... 372/96, 50, 44, 45, 372/46, 108

[56] References Cited

U.S. PATENT DOCUMENTS 4,464,762 8/1984 Furuya .................................. 372/50

Primary Examiner—James W. Davie
Attorney, Agent, or Firm—Birch, Stewart, Kolasch and Birch

[57] ABSTRACT

The disclosure is directed to an improved semiconductor laser device which includes a first light deriving optical waveguide connected approximately perpendicularly to a light exit face at one side, a second light deriving optical waveguide connected approximately perpendicularly to another light exit face at the other side and having an optical axis different from that of the first light deriving optical waveguide, and a light emitting optical waveguide subjected to optical coupling with a periodical diffraction grating for optical resonance, and connected to end portions of the first and second light deriving optical waveguides within the semiconductor laser device.

6 Claims, 6 Drawing Figures

OPTICAL ELEMENT IN SEMICONDUCTOR LASER DEVICE HAVING A DIFFRACTION GRATING AND IMPROVED RESONANCE CHARACTERISTICS

BACKGROUND OF THE INVENTION

The present invention generally relates to a semiconductor laser and more particularly, to a semiconductor laser device of a distributed feedback type or distributed Bragg reflection type which may be oscillated in a single longitudinal mode.

In cases where a semiconductor laser device is to be utilized as a signal source for a large capacity and long distance light transmitting system employing optical fibers or as a measuring optical power output device for use in a measuring work, etc., it is desirable that such a semiconductor laser device has operating characteristics for oscillation in a single longitudinal mode. In semiconductor laser device structures of which the longitudinal mode is simplified, the structure which has conventionally been regarded as the most superior is the arrangement in which a diffraction grating having a periodical concave and convex configuration is formed in a light propagating direction at an active region or in the vicinity of the active region, thereby to obtain laser oscillation at a predetermined wavelength to be determined by a pitch of the diffraction grating and a light propagating constant or velocity within an optical waveguide, by causing the above diffraction grating to be coupled with light.

The structure as referred to above may be broadly divided into the distributed Bragg reflection type which utilizes the diffraction grating as a reflector which reflects only light with a specific wavelength, and the distributed feedback type which obtains feedback with respect to light with a specific wavelength.

Subsequently, the structure of a conventional distributed feedback type semiconductor laser device will be described with reference to FIGS. 1 and 2, in which FIG. 1 is a perspective view of a conventional InGaAsP semiconductor laser device, and FIG. 2 is a diagram showing on an enlarged scale, a diffraction grating portion in the semiconductor laser device of FIG. 1.

As shown in FIG. 1, the InGaAsP semiconductor laser device includes an n-type InP substrate 1 having a (001) face formed with a periodical concave and convex configuration at a crystal growth face side thereof, and an optical guide layer 2 of n-type InGaAsP, a n-type InP buffer layer (or cladding layer) 3, a non-doped InGaAsP active layer 4, a p-type InP cladding layer 5, a p-type InGaAsP cap layer 6 and a current confinement insulating layer 7 made of $SiO_2$, which are successively laminated onto said n-type InP substrate 1, with a p-side electrode 8 and a n-side electrode 9 being applied onto upper and lower sides of the device in FIG. 1 to hold the above laminated layers therebetween. Moreover, light exit faces 10 and 11 which emit a laser beam at cleavage faces (110) and ($\bar{1}$10) are formed as shown. The diffraction grating is formed in a direction parallel to the light exit faces 10 and 11, and constitutes a wave-like member at a constant pitch between the light exit faces 10 and 11. Faces 12 of the diffraction grating are generally of (111)A faces.

The known distributed feedback type semiconductor laser device having the structure as described above is arranged to achieve the single longitudinal mode oscillation through utilization of the fact that the diffraction grating provided in the waveguide which serves as a light emitting region, selectively reflects only light with a specific wavelength. However, if the p-side electrode 8 is continuously formed extending between the both light exit faces 10 and 11, unnecessary light with a wavelength region not reflected by the diffraction grating is to be optically amplified by the so-called Fabry-Perot resonator function in which the light is subjected to a multiple reciprocating motion by being reflected between the opposite light exit faces 10 and 11 which are set as resonant end faces, and therefore, light having wavelengths other than the wavelength determined by the diffraction grating is to be subjected to oscillation by satisfying the conditions for the laser oscillation. Accordingly, in order to suppress the oscillation by the Fabry-Perot resonator function as described above, it has been a conventional practice to employ a structure in which the electrode is partially removed between the resonant end faces 10 and 11 to form a non-conduction region 13 where no carrier is injected. By the above structure, no current flows in said non-conduction region 13 and the light not reflected by the diffraction grating is attenuated at this portion, thereby making it possible to suppress the oscillation due to the Fabry-Perot resonance mode.

However, the structure in which a light absorbing region for attenuating light is formed as described above has such disadvantages that it lacks working efficiency owing to a difficulty in the discrimination between a light emitting region and a light absorbing region, and that the undesirable oscillation in the Fabry-Perot resonance mode can not be sufficiently suppressed due to incapability for perfectly attenuating light.

Incidentally, the faces 12 and 12' of the diffraction grating are normally constituted by (111)A and ($\bar{1}\bar{1}$1)A faces. In a zinc blend crystal such as InP or the like, surface energy is larger in the order as in [111]A>[001]>[011], and therefore, if the crystal formed with the diffraction grating is left to stand at a high temperature in the crystal growth process subsequent to the optical guide layer 2 after formation of the diffraction grating, the (001) face gradually appears from the periodical concave and convex configuration formed with the (111)A, and ($\bar{1}\bar{1}$1) faces, and there are cases where the periodical concave and convex configuration completely disappears in an extreme instance.

As described so far, the conventional distribution feedback laser devices have such problems that Fabry-Perot resonance mode is not perfectly suppressed, and that there is a possibility that the diffraction grating disappears during holding at a high temperature prior to the crystal growth.

SUMMARY OF THE INVENTION

Accordingly, an essential object of the present invention is to provide an improved semiconductor laser device in which Fabry-Perot resonance mode is suppressed, while disappearance of a diffraction grating in the manufacturing process is prevented, by employing a technical means in a waveguide structure of a semiconductor laser device having the diffraction grating of a distributed feedback type, distributed Bragg reflection type or the like, with a substantial elimination of disadvantages inherent in the conventional devices of the kind.

Another important object of the present invention is to provide a semiconductor laser device of the above described type which is simple in structure and stable in function with high reliability, and can be readily manufactured on a large scale at low cost.

In accomplishing these and other objects, according to one preferred embodiment of the present invention, there is provided a semiconductor laser device which comprises a first light deriving optical waveguide connected approximately perpendicularly to a light exit face at one side, a second light deriving optical waveguide connected approximately perpendicularly to another light exit face at the other side and having an optical axis different from that of the first light deriving optical waveguide, and a light emitting optical waveguide subjected to optical coupling with a periodical diffraction grating for optical resonance, and connected to end portions of the first and second light deriving optical waveguides within the semiconductor laser device.

By the arrangement according to the present invention as described above, a highly efficient semiconductor laser device has been advantageously presented through a simple structure.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENT

Figure 1:
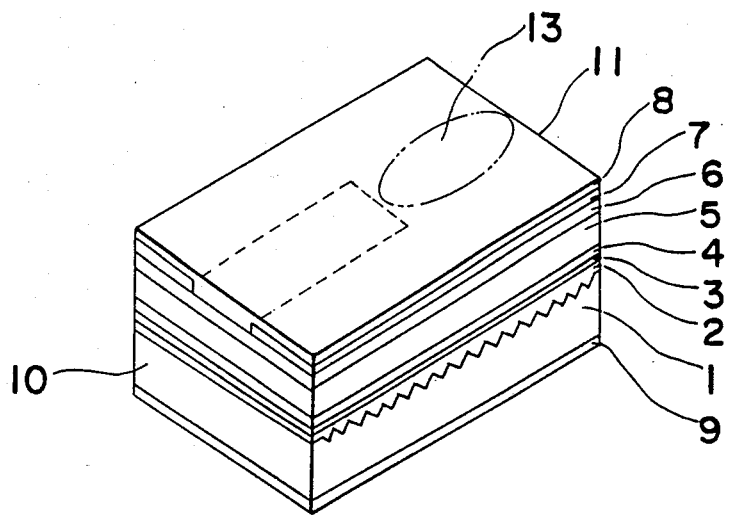
FIG. 1 is a perspective view of a conventional distributed feedback type semiconductor laser device.
Figure 2:
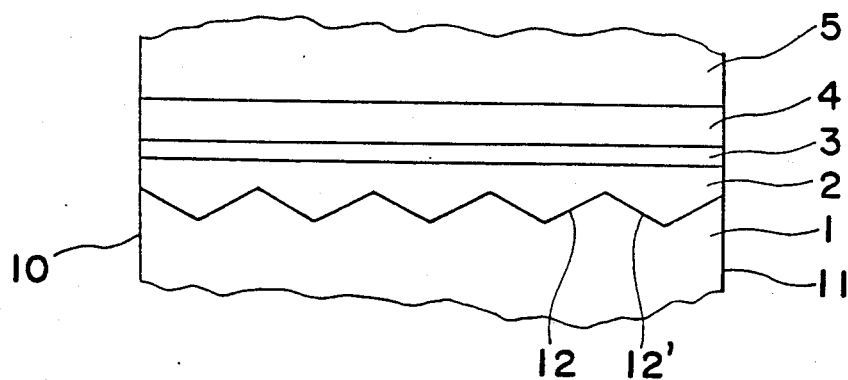
FIG. 2 is a diagram showing on an enlarged scale, an essential portion in the semiconductor laser device of FIG. 1.

Before the description of the present invention proceeds, it is to be noted that like parts are designated by like reference numerals throughout the accompanying drawings.

Figure 3:
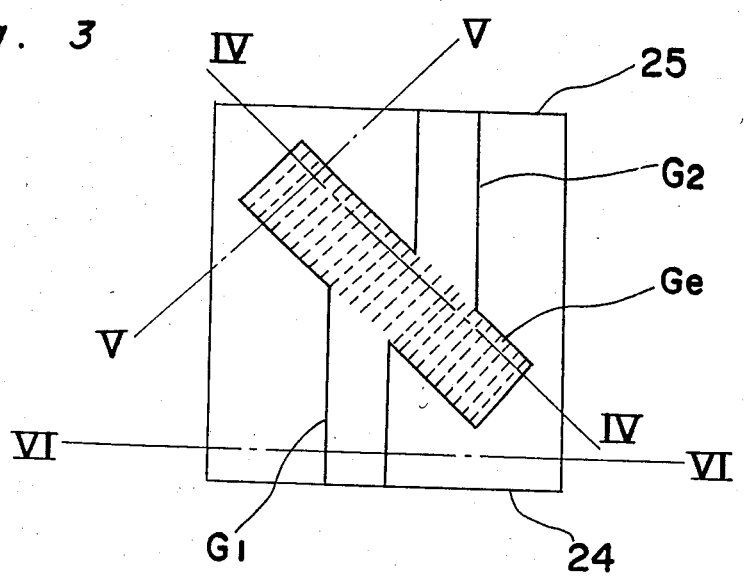
FIG. 3 is a top plan view of a semiconductor laser device according to one preferred embodiment of the present invention.
Figure 4:
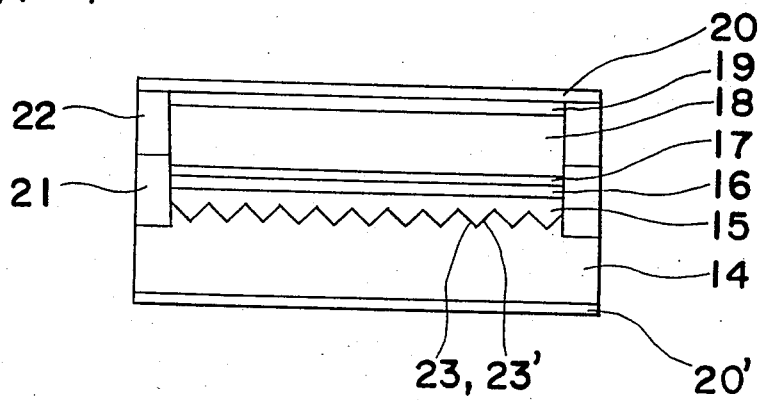
FIG. 4 is a cross section taken along the line IV—IV in FIG. 3.
Figure 5:
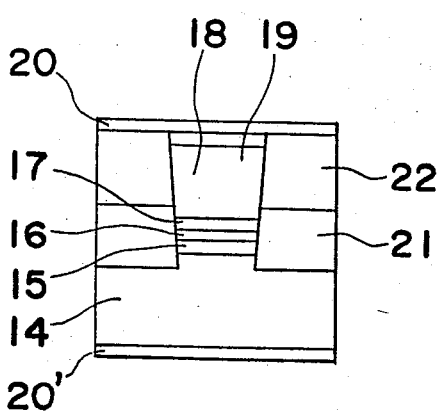
FIG. 5 is a cross section taken along the line V—V in FIG. 3.
Figure 6:
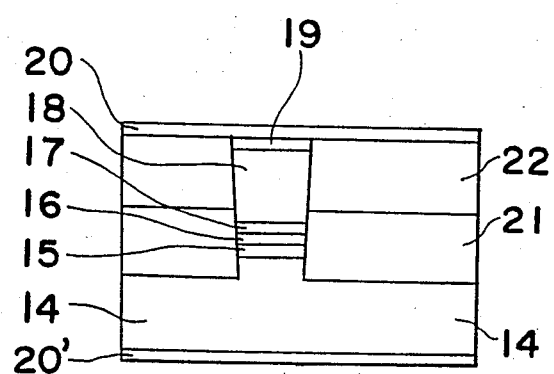
FIG. 6 is a cross section taken along the line VI—VI in FIG. 3.

Referring now to the drawings, there is shown in FIGS. 3 through 6, the structure of a semiconductor laser device according to one preferred embodiment of the present invention, in which FIG. 3 is a top plan view of the semiconductor laser device, and FIGS. 4 to 6 are cross sectional views taken along the lines IV—IV, V—V, and VI—VI in FIG. 3 respectively.

As shown in the drawings, the semiconductor laser device according to the present invention generally includes a first light deriving optical waveguide G1 connected approximately perpendicularly to a light exit face 24 at one side, a second light deriving optical waveguide G2 connected approximately perpendicularly to another light exit face 25 at the other side and having an optical axis different from that of the first light deriving optical waveguide G1, and a light emitting optical waveguide Ge subjected to optical coupling with a periodical diffraction grating for optical resonance, and connected to end portions of the first and second light deriving optical waveguides G1 and G2 within said semiconductor laser device.

More specifically, on a growth face of an n-type InP substrate 14 in which a crystal growth face is a (001) plane, the diffraction grating by the periodical concave and convex configuration is formed only on a rectangular area in a diagonal direction as shown by rows of dotted lines in FIG. 3, with the direction of the grating being set to be inclined by 45° from the light exit faces 24 and 25. It is to be noted that the light exit faces 24 and 25 are assumed to be (110) and (1$\bar{1}$0). A chemical etchant (for example, HBr:CH$_3$COOH=1:1) is so selected that faces 23 and 23' of the diffraction grating become (011) and (0$\bar{1}$1) faces so as to form the diffraction grating by the etching process. On the Inp substrate 14, an n-type InGaAsP guide layer 15, an n-type InP buffer layer (cladding layer) 16, a non-doped InGaAsP active layer 17, a p-type InP clad layer 18 and a p-type-InGaAsP cap layer 19 are successively grown by a liquid phase epitaxial growth method. The buffer layer 16 referred to above functions to leak part of light produced in the active layer 17 into the diffraction grating. Subsequently, except for the portion surrounded by solid lines in FIG. 3, the respective grown layers 15, 16, 17, 18 and 19 are removed at the outer side of the above portion through the etching process by a depth reaching the substrate 14, and thereafter, the portion thus removed by the etching is filled with a laminate of a p-type-InP buried layer 21 and an n-type InP buried layer 22, while a p-side electrode 20 is formed on the cap layer 19, with an n-side electrode 20' being formed on the substrate 14, whereby the laser device is fabricated.

The laser device structure as described above includes the optical waveguide Ge having the optical resonance diffraction grating formed in the region shown by the rows of dotted lines in FIG. 3, and the two optical waveguides G1 and G2 having forward ends thereof appearing at the light exit faces 24 and 25 so as to intersect at right angles with said light exit faces 24 and 25, and also crossing the optical waveguide Ge having the diffraction grating. In the above structure, the optical waveguide Ge having the diffraction grating and extending in the direction of the diagonal lines serves as a light emitting region of the laser beam, while the other two optical waveguides G1 and G2 form light deriving optical waveguides having optical axes thereof different from each other.

The optical waveguide Ge having the diffraction grating has the faces 23 and 23' of the diffraction grating shown in FIG. 4 formed by (011) and (01$\bar{1}$) faces with minimum surface energy, and accordingly, there is no possibility that the above diffraction grating is deformed or disappears even when maintained at high temperatures during the crystal growth process. On the other hand, the light deriving optical waveguides G1 and G2 have the ends at one side thereof appearing at the light exit faces 24 and 25 formed by a cleavage method, but have the other ends thereof respectively terminated at the optical waveguide Ge having the diffraction grating, thus not constituting a Fabry-Perot resonator. Accordingly, the oscillation in the Fabry-Perot mode can be perfectly suppressed.

Upon injection of carrier into the semiconductor laser device having the structure as described so far through the electrodes 20 and 20', the light leaking from the active layer 17 is subjected to an optical coupling with the diffraction grating, and in the optical waveguide Ge having the diffraction grating of the active layer 17, the optical wave reciprocates in the diffraction grating for resonance, and thus, the laser oscillating function is started. The light in the above optical waveguide Ge is radiated as a laser beam from the light exit faces 24 and 25 through the pair of light deriving optical waveguides G1 and G2 connected at the end portions. Since the light deriving optical waveguides G1 and G2 are provided in pair at the left and right sides, with the optical axes thereof deviated, it is possible to obtain output monitoring light which is difficult to obtain in the conventional distributed feedback type laser device.

It is to be noted here that in the foregoing embodiment, although the present invention has been mainly described with reference to the structure of the distributed feedback type semiconductor laser device, the present invention is not limited in its application to such distributed feedback type semiconductor laser device alone, but may readily be applied to the structure of the distributed Bragg reflection type. Furthermore, other than the InGaAsP buried type laser device, the present invention may be applied to laser devices having various waveguide structures for lateral mode employing semiconductor materials of GaAlAs group, GaAlAsSb group and others.

As is clear from the foregoing description, according to the present invention, it is possible to emit the laser beam in two directions while perfectly suppressing the Fabry-Perot mode, and since there is no disappearance of the diffraction grating even when held at high temperatures during manufacture, yield in the production can be improved. Moreover, owing to the favorable workability, highly reliable laser devices may be readily produced on a large scale at low cost.

Although the present invention has been fully described by way of example with reference to the accompanying drawings, it is to be noted here that various changes and modifications will be apparent to those skilled in the art. Therefore, unless such changes and modifications otherwise depart from the scope of the present invention, they should be construed as included therein.

What is claimed is:

1. An optical element in a semiconductor laser device comprising:
    a periodical diffraction grating;
    a light emitting waveguide, optically coupled with said periodical diffraction grating for optical resonance, said light emitting waveguide emitting light received from a active layer of said element, said light emitting waveguide being substantially disposed in a first plane;
    first and second light exit faces, each said exit face having an exit portion thereof;
    a first optical waveguide connected to said light emitting waveguide and providing a first transmission path for light emitted from said light emitting waveguide to said first light exit face, said first optical waveguide being substantially disposed in said first plane and intersecting said first light exit face; and
    a second optical waveguide connected to said light emitting waveguide and providing a transmission path for light emitted from said light emitting waveguide to said second light exit face, said second optical waveguide being substantially disposed in said first plane and intersecting said second light exit face, wherein said first and second optical waveguides are disposed between said first and second exit faces, are noncolinear and do not intersect one another.

2. The optical element in a semiconductor laser device as claimed in claim 1, wherein said light emitting waveguide is disposed between said first and second exit faces, said light emitting waveguide being disposed in said first plane and diagonally intersecting said first and second optical waveguides.

3. The optical element in a semiconductor laser device as claimed in claim 1 wherein the diffraction grating exhibits a waveshape having a periodical concave and convex configuration, with a direction of periodicity being cure bracket substantially parallel to a direction of said light emitting waveguide, said direction being defined as a direction from an intersection of said light emitting waveguide and said first optical waveguide to an intersection of said light emitting waveguide and said second optical waveguide.

4. The optical element in a semiconductor laser device as claimed in claim 2, wherein the diffraction grating is formed by a wave in a periodical concave and convex configuration, with a wave direction being set substantially parallel to said light emitting waveguide, said direction being defined as a direction from a intersection of said light emitting waveguide and said first optical waveguide to an intersection of said light emitting waveguide and said second optical waveguide.

5. The optical element of claim 1 wherein said first and second exit faces are disposed in second and third substantially parallel planes, said second and third planes being substantially orthogonally disposed with respect to said first plane.

6. The optical element of claim 1 wherein said first and second optical waveguides are substantially parallel.

* * * * *